US007459939B2

(12) United States Patent
Testin et al.

(10) Patent No.: US 7,459,939 B2
(45) Date of Patent: Dec. 2, 2008

(54) ACTIVE PULL UP APPARATUS FOR A DATA BUS

(75) Inventors: William John Testin, Indianapolis, IN (US); David Gene Novak, Westfield, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 339 days.

(21) Appl. No.: 10/569,156

(22) PCT Filed: Sep. 9, 2004

(86) PCT No.: PCT/US2004/029522

§ 371 (c)(1),
(2), (4) Date: Feb. 21, 2006

(87) PCT Pub. No.: WO2005/024642

PCT Pub. Date: Mar. 17, 2005

(65) Prior Publication Data

US 2006/0290811 A1 Dec. 28, 2006

Related U.S. Application Data

(60) Provisional application No. 60/501,894, filed on Sep. 9, 2003.

(51) Int. Cl.
*H03K 19/175* (2006.01)
(52) U.S. Cl. .......................... 326/86; 326/81; 327/434; 375/275

(58) Field of Classification Search .................. 326/86, 326/81; 327/434; 375/275
See application file for complete search history.

(56) References Cited

U.S. PATENT DOCUMENTS

| 5,336,948 | A | * | 8/1994 | Jordan | 326/22 |
| 5,521,528 | A | * | 5/1996 | Mammano et al. | 326/30 |
| 5,635,852 | A | * | 6/1997 | Wallace | 326/30 |
| 5,689,196 | A | * | 11/1997 | Schutte | 326/86 |
| 5,831,467 | A | * | 11/1998 | Leung et al. | 327/319 |

(Continued)

OTHER PUBLICATIONS

Search Report dated May 4, 2005.

*Primary Examiner*—Vibol Tan
(74) *Attorney, Agent, or Firm*—Joseph J. Laks; Robert D. Shedd; Brian J. Cromarty

(57) ABSTRACT

An active pull up configuration for data bus lines unaffected by integral pull up resistors within subsystems. The present application generally relates to digital systems comprising a plurality of power supply levels and data buses. More particularly, this invention relates to digital system comprising subsystems connected by common buses that require automatic charging of certain buses or lines. In a television signal processing apparatus using an I2C bus and using the present invention according to a exemplary embodiment of the present invention, a first device operative in a first mode of operation and a second device operative in said first mode of operation and a second mode of operation wherein said first circuit and said second circuit are both connected by the I2C bus wherein said each data bus line requiring an active pull up is connected to a first power supply via a first resistor integrated within the first device and connected to a second power supply via a second resistor integrated within said second device. The first resistor is electrically isolated from the first power supply during the second mode of operation and electrically connected to the first power supply during the second mode of operation.

15 Claims, 6 Drawing Sheets

U.S. PATENT DOCUMENTS

| | | |
|---|---|---|
| 5,892,893 A | 4/1999 | Hanf et al. |
| 5,966,044 A * | 10/1999 | Naka .......................... 327/535 |
| 6,005,432 A * | 12/1999 | Guo et al. ................... 327/333 |
| 6,181,193 B1 * | 1/2001 | Coughlin, Jr. ............... 327/534 |
| 6,356,106 B1 * | 3/2002 | Greeff et al. .................. 326/30 |
| 6,771,095 B1 * | 8/2004 | Dunlea et al. ................. 326/86 |
| 6,781,415 B2 * | 8/2004 | Clark et al. ................... 326/81 |

* cited by examiner

ACTIVE PULL UP APPARATUS FOR A DATA BUS

This application claims the benefit, under 35 U.S.C. § 365 of International Application PCT/US04/29522 filed Sep. 9, 2004, which was published in accordance with PCT Article 21(2) on Mar. 17, 2005 in English and which claims the benefit of U.S. provisional patent application No. 60/501,894 filed Sep. 9, 2003.

FIELD OF THE INVENTION

Background of the Invention

The present application generally relates to digital systems comprising a plurality of power supply levels, operating modes and at least one data bus. Systems such as television systems, home and portable audio systems, and satellite reception systems may contain more than one power supply level or operating mode. Examples of operating modes would be run modes, where the system is operating in its primary intended mode of operation, such as with a television system, where the system is receiving a television signal, decoding the signal and displaying the image on a television screen. In a standby mode, a system is in a secondary operating mode, typically performing only a subset of the functions performed in the run mode, and possibly a number of functions not normally performed in run mode operation. In a television system, no picture is displayed and no audio is played, but some portions of the electronics may be powered to receive broadcast administrative or guide data, or waiting for remote control commands to resume run mode. During the off mode, power is removed from the instrument and no subsystems are powered.

In standby mode, it is desirable to remove power from as many systems as possible to reduce power consumption. Reduced power consumption leads to reduced thermal emissions from the electronics and reduces the requirement for active cooling systems such as fans. The elimination of the requirement for active cooling systems during standby mode has the desirable effect of further decreasing the power consumption and reducing noise generation when the device is not in use by the user.

A problem that arises when trying to remove power from as many subsystems as possible occurs when one or more systems or integrated circuits comprise integrated pull up resistors. FIG. 1, illustrates a commonly employed method of charging a data bus line (150) and illustrates the problems that occur when more than one subsystem (130, 140) is attached to the same data bus line (150), each with their respective integrated pull up resistor (135, 145). When the system shown in FIG. 1 is operating in the run mode, voltage is applied at both the second power supply (120) and the first power supply (110). When the system is put into standby mode and only subsystem 2 (140) is required to maintain standby operations, it is desirable to remove power from subsystem 1 (130) while maintaining power to subsystem 2 (140). A problem now occurs because once the first power supply (110) is set to zero volts, the combination of a first resistor (135) and a second resistor (145) become a voltage divider for the second power supply (120) and the data bus line (150) voltage drops to a less than desirable level as a result of the divided voltage between the second power supply level (120) and zero volts. It would therefore be desirable to remove the first resistor (135) and have the second resistor (145) apply the required charge the bus line (150). However often subsystems are designed or fabricated by outside entities and come with integrated pull up resistors that cannot be easily removed. This is especially true with integrated circuits where the pull up resistors are internal to the integrated circuit and cannot be removed. It would be desirable to find an alternate method to be able to remove the voltage from a first subsystem (130) and maintaining voltage for a second subsystem (140), while avoiding the undesirable effects of divided voltage described above and without requiring the removal of the pull up resistor of the powered down subsystem.

SUMMARY OF THE INVENTION

In accordance with an aspect of the present invention, an apparatus having a first mode of operation and a second mode of operation comprising a data bus, a first power supply operating in said first mode, a second power supply operating in said first mode, a third power supply operating in said first mode and said second mode; and a transistor with a base, collector and emitter wherein said first power supply is electrically coupled to the base, the second power supply being electrically coupled to the collector, the signal line being electrically coupled to the emitter and the third power supply being electrically coupled to the signal line wherein said transistor is forward biased during said first mode and reverse biased during said second mode.

BRIEF DESCRIPTION OF THE DRAWING

The above-mentioned and other features and advantages of this invention, and the manner of attaining them, will become more apparent and the invention will be better understood by reference to the following description of embodiments of the invention taken in conjunction with the accompanying drawings, wherein.

DETAILED DESCRIPTION OF THE PREFERRED EMBODIMENT

The exemplifications set out herein illustrate preferred embodiments of the invention, and such exemplifications are not to be construed as limiting the scope of the invention in any manner.

Figure 1:
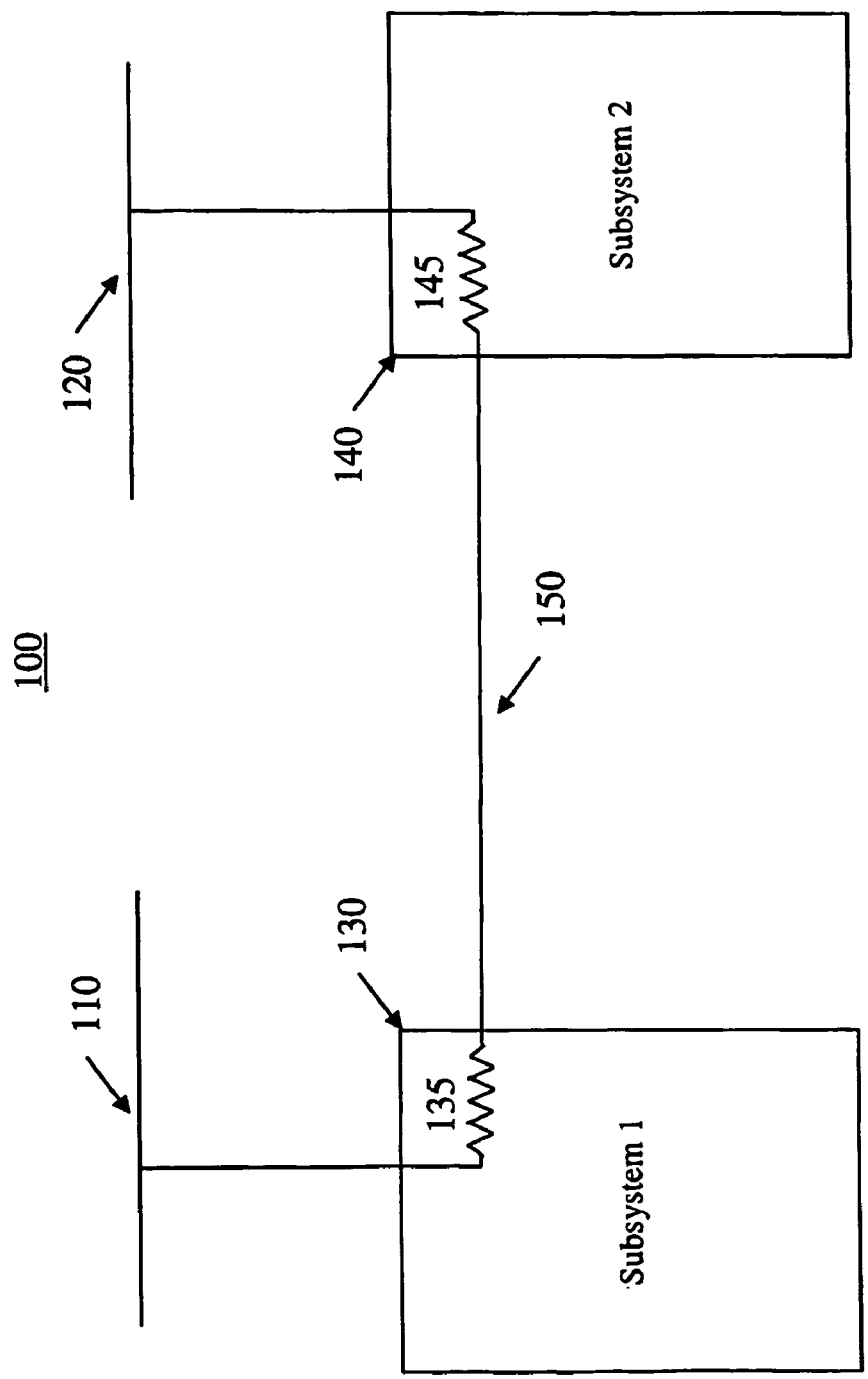
FIG. 1 is a circuit diagram of a data bus line with pull up resistors integral to their respective subsystems according to the prior art.

Referring to FIG. 1, a circuit diagram of a data bus line with pull up resistors integral to their respective subsystems according to the prior art 100 is shown. The system depicted in FIG. 1, comprises a first power supply 110, operative in a first mode of operation, a second power supply 120, operative in the first mode of operation and a second mode of operation, a first subsystem 130, comprising a first pull up resistors 135, a second subsystem 140 comprising a second pull up resistor 145, wherein the first subsystem 130 and the second subsystem 140 are both connected to at least one data bus line 150. The data bus line could be, for example, an I²C bus line as is commonly used in consumer electronics systems such as television signal processing apparatuses.

Figure 2:
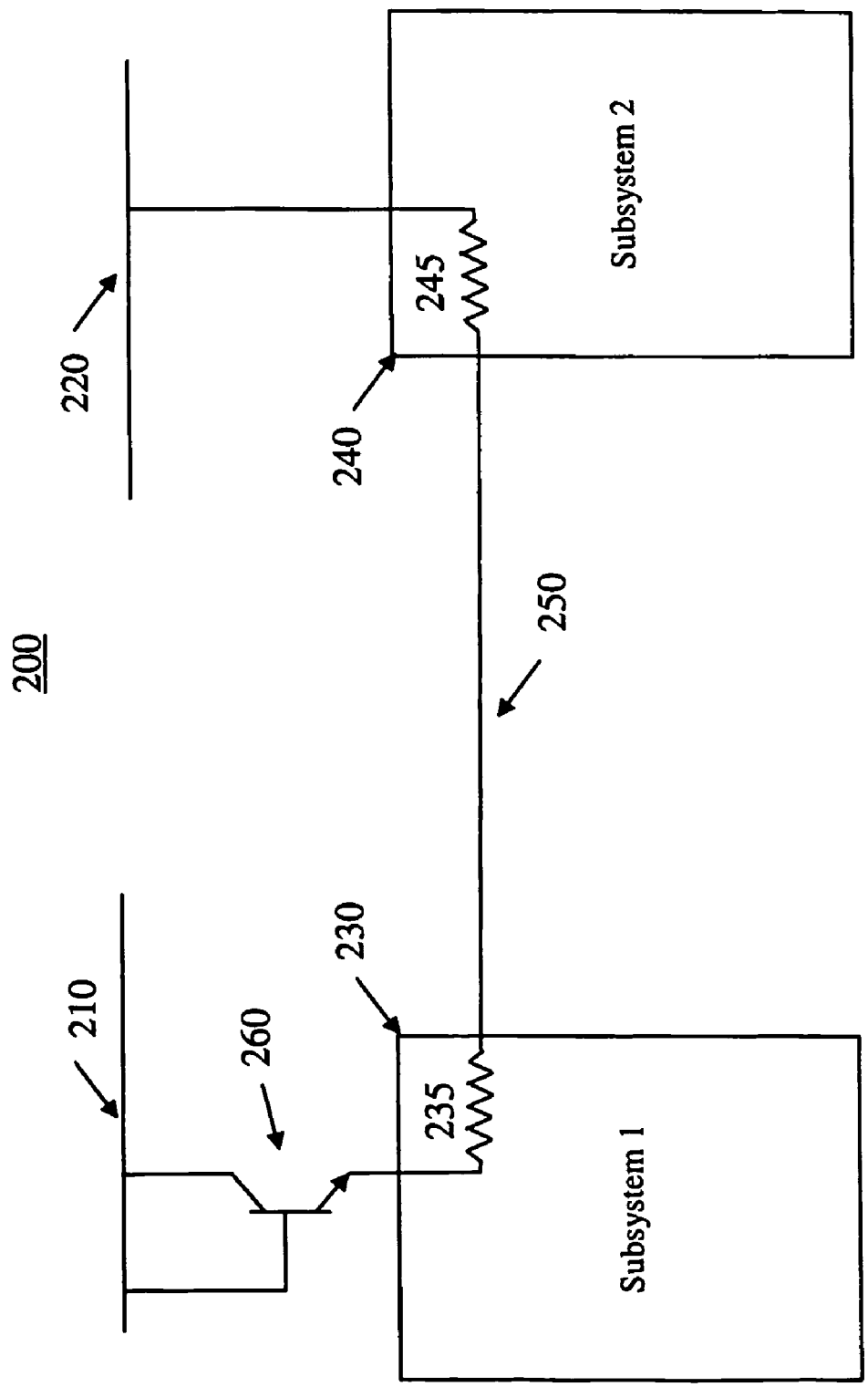
FIG. 2 is a block diagram of a data bus line with pull up resistors integral to their respective subsystems circuitry according to a first exemplary embodiment of the present invention.

Referring to FIG. 2, a block diagram of a data bus line with pull up resistors integral to their respective subsystems circuitry according to a first exemplary embodiment of the present invention is shown. The system depicted in FIG. 2, comprises a first power supply 210, operative in a first mode of operation, a second power supply 220, operative in a first and second mode of operation, a first subsystem 230, comprising a first pull up resistors 235, a second subsystem 240 comprising a second pull up resistor 245, wherein the first subsystem 230 and the second subsystem 240 are both connected to at least one data bus line 250 and a first transistor 260 wherein the base and collector of said transistor 260 are connected to the first power supply 210, and the emitter of the transistor is connected to the first subsystem 230 including a connection to the pull up resistor 235 internal to the first subsystem 230.

In this exemplary embodiment shown in FIG. 2, when the system 200 is operating in the first mode of operation, a run mode, power is supplied by both the first power supply 210 and the second power supply 220. When power is applied by the first power supply 210 to the base of the first transistor 260, the transistor 260 becomes conductive between the collector and emitter, and power is supplied to the first subsystem. The power supplied by the exemplary embodiment is approximately 0.7 volts less than the power supplied to the base of the transistor 260 and subsequently resulting in a 0.7 volt drop between the collector and emitter. A resistor network can be added to the base supply line and/or the collector of the transistor 260 to ensure the transistor is saturated resulting in only a 0.2 volt drop between the collector and the emitter of the transistor 260. When the system 200 is placed in the second mode of operation, a standby mode where some of the subsystems are powered down to reduce energy consumption and heat generation, power is removed from the first power supply 210. Power is still supplied to subsystem 2 240 by the second power supply 220. The data bus line is charged through the second pull up resistor 245 internal to subsystem 2 240. This pull up voltage on the data bus line 250 results in a reverse bias of the first transistor 260 electrically disconnecting the data bus line 250 from the first power supply 210.

Figure 3:
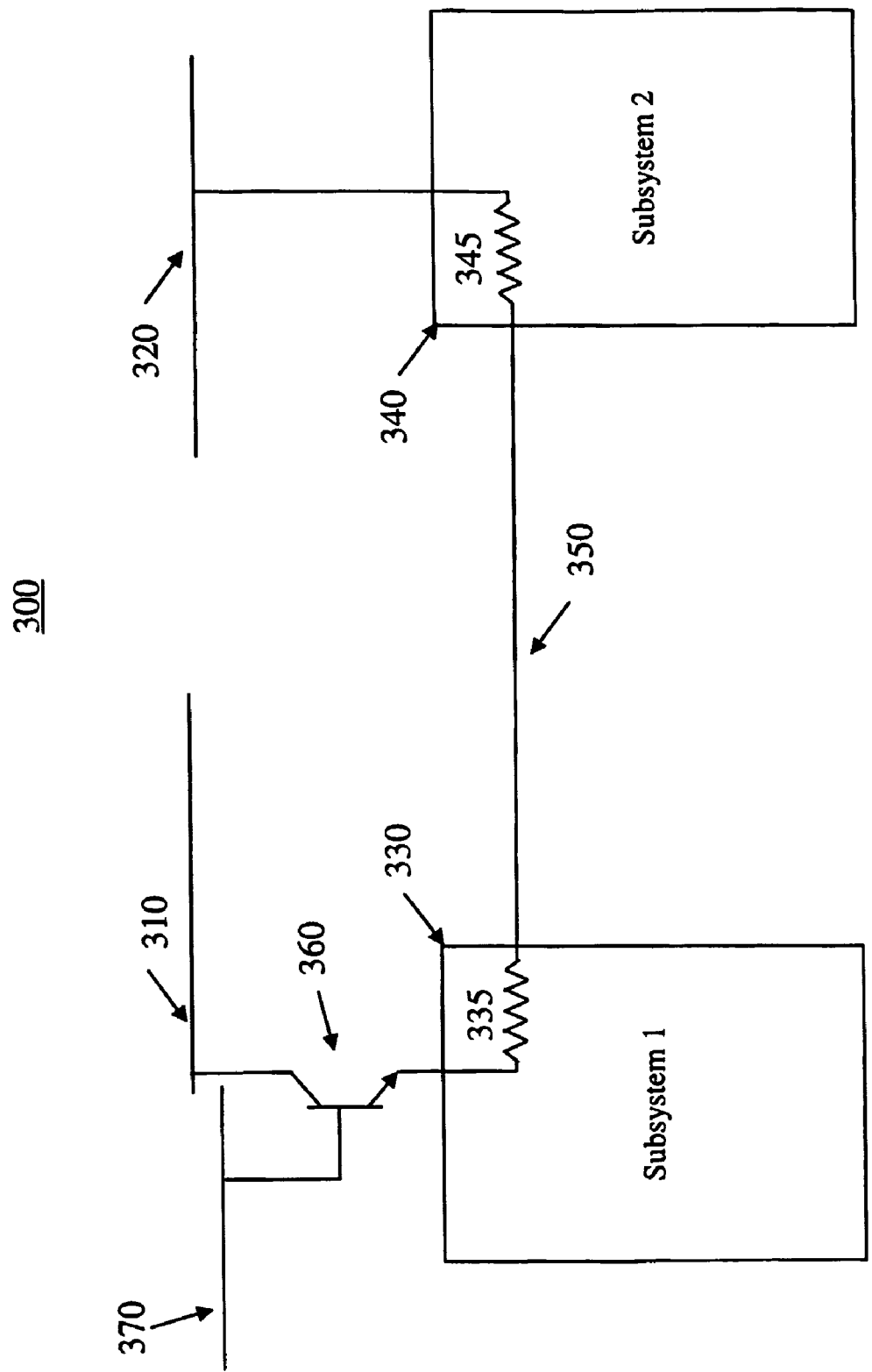
FIG. 3 is a block diagram of a data bus line with pull up resistors integral to their respective subsystems circuitry according to a second exemplary embodiment of the present invention.

Referring to FIG. 3, a block diagram of a data bus line with pull up resistors integral to their respective subsystems circuitry according to a second exemplary embodiment of the present invention is shown. The system depicted in FIG. 3, comprises a first power supply 310, operative in a first mode of operation, a second power supply 320, operative in a first and second mode of operation, a third power supply 370 operative in a first mode of operation, a first subsystem 330, comprising a first pull up resistors 335, a second subsystem 340 comprising a second pull up resistor 345, wherein the first subsystem 330 and the second subsystem 340 are both connected to at least one data bus line 350 and a first transistor 360 wherein the collector of said transistor 360 is connected to the first power supply 310, the base of said transistor 360 is connected to the third power supply and the emitter of the transistor is connected to the first subsystem 330 including a connection to the pull up resistor 335 internal to the first subsystem 330.

In this exemplary embodiment shown in FIG. 3, when the system 300 is operating in the first mode of operation, a run mode, power is supplied by the first power supply 310 and the second power supply 320 and the third power supply 370. When power is applied by the third power supply 370 to the base of the first transistor 360, the transistor 360 becomes conductive between the collector and emitter, and power is supplied to the first subsystem. The power supplied by the third power supply 370 can be chosen to have a value high enough to ensure the transistor is saturated resulting in only a 0.2 volt drop between the collector and the emitter of the transistor 360. The voltage level supplied to the base of the transistor 360 can also be adjusted by supplying a resistive network between the third power supply 370 and the base of the transistor 360. When the system 300 is placed in the second mode of operation, a standby mode where some of the subsystems are powered down to reduce energy consumption and heat generation, power is removed from the first power supply 310 and the third power supply 370. Power is still supplied to subsystem 2 340 by the second power supply 320. The data bus line is charged through the second pull up resistor 345 internal to subsystem 2 340. This pull up voltage on the data bus line 350 results in a reverse bias of the first transistor 360 electrically disconnecting the data bus line 350 from the first power supply 310.

Figure 4:
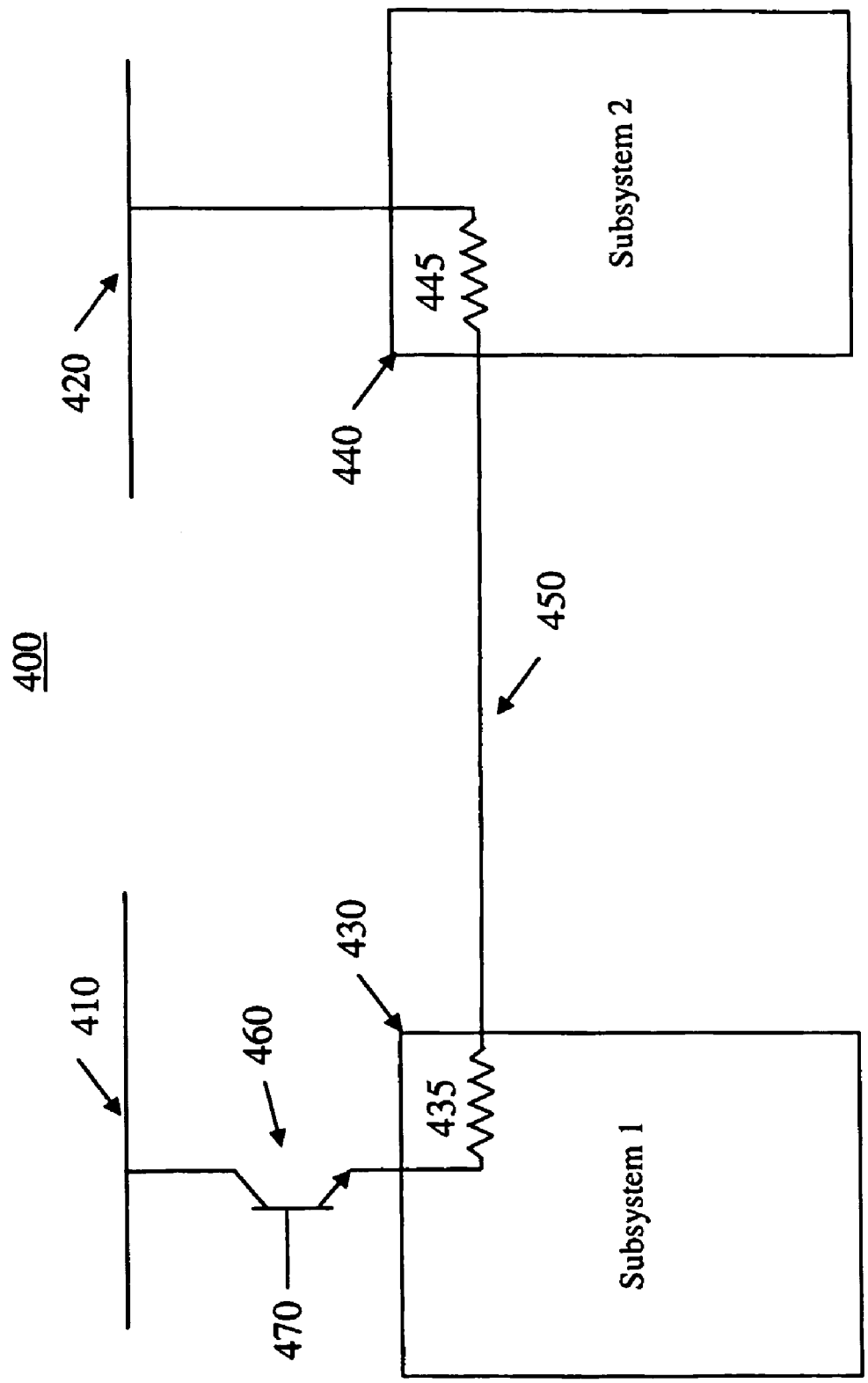
FIG. 4 is a block diagram of a data bus line with pull up resistors integral to their respective subsystems circuitry according to a third exemplary embodiment of the present invention.

Referring to FIG. 4, a block diagram of a data bus line with pull up resistors integral to their respective subsystems circuitry according to a third exemplary embodiment of the present invention is shown. The system depicted in FIG. 4, comprises a first power supply 410, operative in a first mode of operation, a second power supply 420, operative in a first and second mode of operation, a source of a control signal 470, a first subsystem 430, comprising a first pull up resistors 435, a second subsystem 440 comprising a second pull up resistor 445, wherein the first subsystem 430 and the second subsystem 440 are both connected to at least one data bus line 450 and a first transistor 460 wherein the collector of said transistor 460 is connected to the first power supply 410, the base of said transistor 460 is connected to the source of a control signal 470 and the emitter of the transistor is connected to the first subsystem 430 including a connection to the pull up resistor 435 internal to the first subsystem 430.

In this exemplary embodiment shown in FIG. 4, when the system 400 is operating in the first mode of operation, a run mode, a control signal is applied to the base of the first transistor 460 by a source of a control signal 470, such as a microprocessor or a discrete analog circuit, power is supplied by the first power supply 410 and the second power supply 420. When the control signal is applied to the base of the first transistor 460, the transistor 460 becomes conductive between the collector and emitter, and power from the first power supply 410 is supplied to the first subsystem. The level of the control signal should be chosen to have a voltage level high enough to ensure the transistor is saturated resulting in only a 0.2 volt drop between the collector and the emitter of the transistor 460 to ensure that the voltage level supplied to the first subsystem 430 is as close to the voltage level of the first power supply 410 as possible. When the system 400 is placed in the second mode of operation, a standby mode where some of the subsystems are powered down to reduce energy consumption and heat generation, the control signal is removed from the base of the transistor 460. The first power supply 410 voltage may be reduced, turned off, or left at its full voltage level depending on the application. Power is still supplied to subsystem 2 440 by the second power supply 420. The data bus line is charged through the second pull up resistor 445 internal to subsystem 2 440. This pull up voltage on the data bus line 450 results in a reverse bias of the first transistor 460 electrically disconnecting the data bus line 450 from the first power supply 410.

Figure 5:
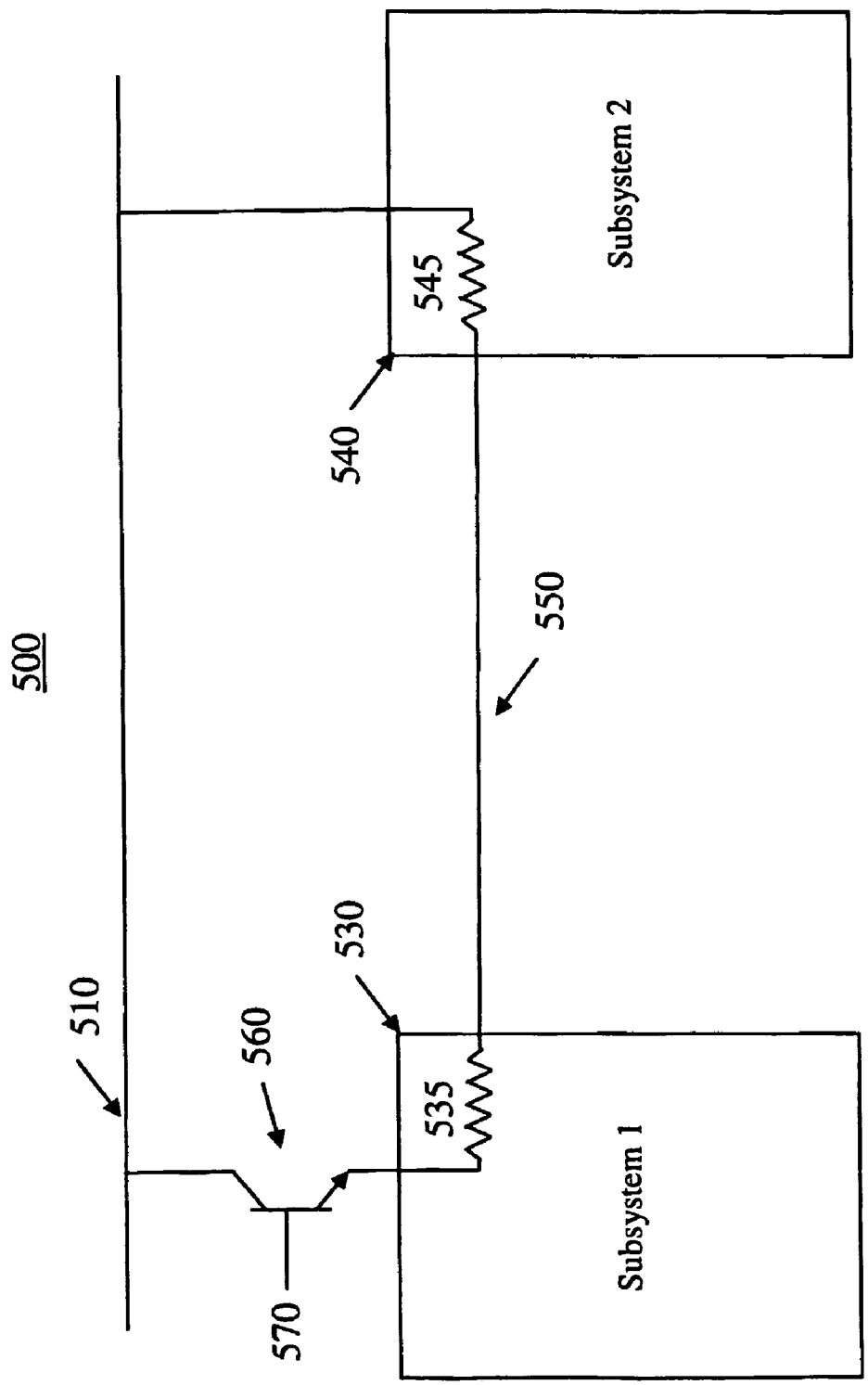
FIG. 5 is a block diagram of a data bus line with pull up resistors integral to their respective subsystems circuitry according to a fourth exemplary embodiment of the present invention.

Referring to FIG. 5, a block diagram of a data bus line with pull up resistors integral to their respective subsystems circuitry according to a fourth exemplary embodiment of the present invention is shown. The system depicted in FIG. 5, comprises a first power supply 510, operative in a first mode of operation and second mode of operation, a source of a control signal 570, a first subsystem 530, comprising a first pull up resistors 535, a second subsystem 540 comprising a second pull up resistor 545, wherein the first subsystem 530 and the second subsystem 540 are both connected to at least one data bus line 550 and a first transistor 560 wherein the collector of said transistor 560 is connected to the first power supply 510, the base of said transistor 560 is connected to the source of a control signal 570 and the emitter of the transistor is connected to the first subsystem 530 including a connection to the pull up resistor 535 internal to the first subsystem 530.

In this exemplary embodiment shown in FIG. 5, when the system 500 is operating in the first mode of operation, a run mode, a control signal is applied to the base of the first transistor 560 by a source of a control signal 570, such as a microprocessor or a discrete analog circuit, power is supplied by the first power supply 510. The source of the control signal 570 can also be a second power supply operative in only the first mode of operation, having a voltage high enough to forward bias the transistor 560 only in the first mode of operation and a voltage low enough in the second mode of operation to reverse bias the transistor 560 in the second mode of operation. When the signal is applied to the base of the first transistor 560, the transistor 560 becomes conductive between the collector and emitter, and power from the first power supply 510 is supplied to the first subsystem. The level of the control signal should be chosen to have a voltage level high enough to ensure the transistor is saturated resulting in only a 0.2 volt drop between the collector and the emitter of the transistor 560 to ensure that the voltage level supplied to the first subsystem 530 is as close to the voltage level of the first power supply 510 as possible. When the system 500 is placed in the second mode of operation, a standby mode where some of the subsystems are powered down to reduce energy consumption and heat generation, the control signal is removed from the base of the transistor 560. Power is supplied to subsystem 2 540 by the first power supply 510. The data bus line is charged through the second pull up resistor 545 internal to subsystem 2 540. This pull up voltage on the data bus line 550 results in a reverse bias of the first transistor 560 electrically disconnecting the data bus line 550 from the first power supply 510.

Figure 6:
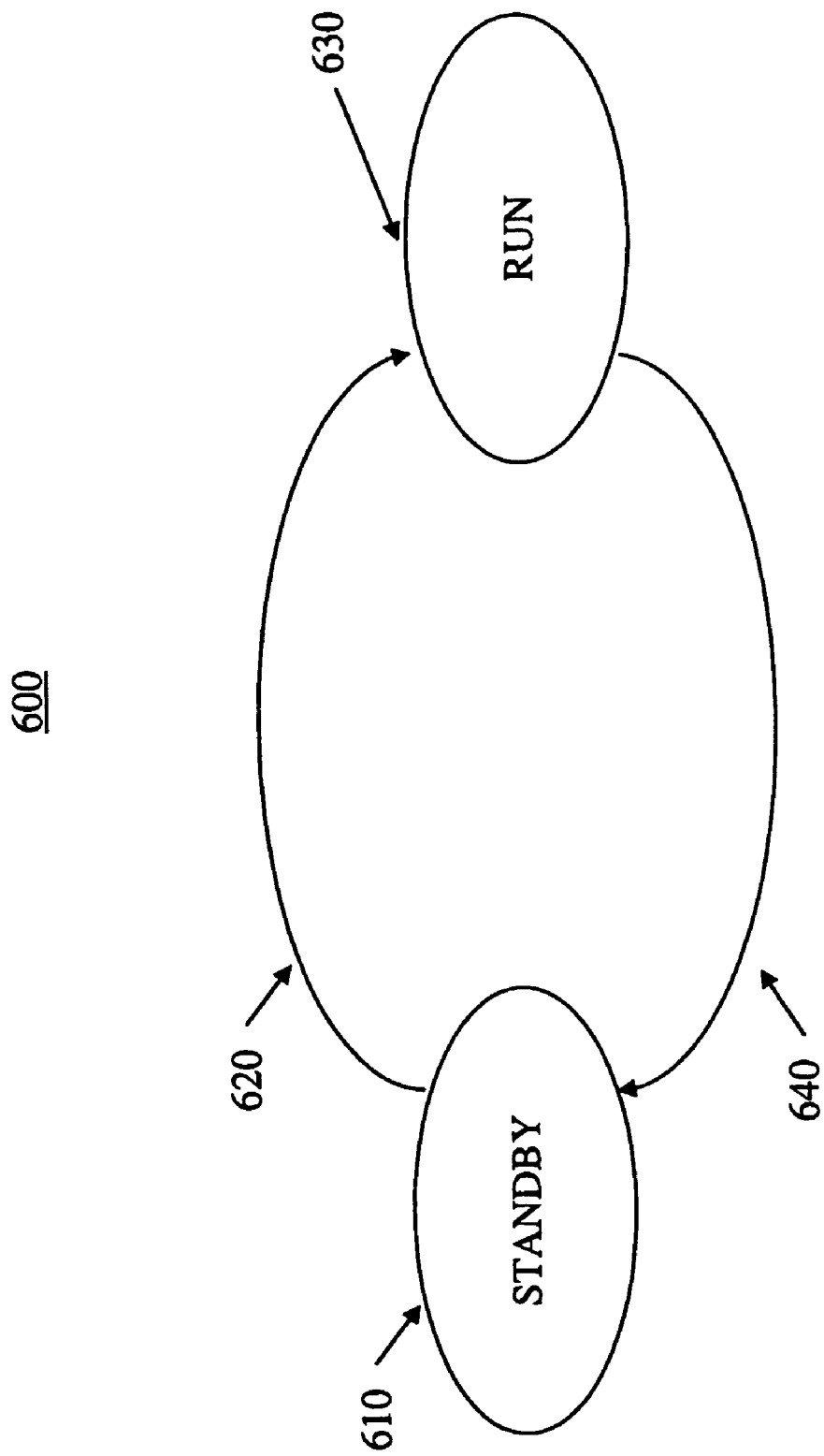
FIG. 6 is a state diagram of an exemplary embodiment of the operation of circuitry according to the present invention.

Referring to FIG. 6 a state diagram 600 of an exemplary embodiment of the operation of circuitry according to the present invention is shown. When the system is in a first mode of operation 630, the run mode, all systems that are required for the normal operation of the system are powered and operating. In the run mode, active cooling devices, such as fans, are acceptable and can be used because the user expects and can tolerate some operating noise during this mode mode. However, when the system is in the second mode of operation 610, the standby mode, the system is perceived by the user to be off and the noise generated by active devices is less acceptable. When a user decides to transition the system between the first mode of operation 630 and the second mode of operation 610, a first transition 620 is made wherein the power is removed from the base of the transistor as shown in the previous figures and voltage is removed from systems not required for operation in the standby mode. When a user decides to transition the system between the second mode of operation 610 and the first mode of operation 630, a second transition 640 is made wherein the voltage is applied to the base of the transistor as shown in the previous figures and power is applied to systems required for operation in the run mode.

The invention claimed is:

1. An apparatus having a first mode of operation and a second mode of operation comprising:
   a data bus;
   a first power supply operating in said first mode, but not in said second mode;
   a second power supply operating in said first mode and said second mode;
   a third power supply operating in said first mode, but not in said second mode; and
   a transistor with a base, collector and emitter wherein said third power supply is electrically coupled to the base, said first power supply being electrically coupled to the collector, said data bus being electrically coupled to the emitter and said second power supply being electrically coupled to said data bus;
   wherein said transistor electrically isolates said data bus from said first power supply in said second mode of operation and electrically connects said data bus to said first power supply in said first mode of operation.

2. The apparatus of claim 1 wherein said data bus is connected to the emitter via a resistor.

3. The apparatus of claim 2 wherein the resistor is located within a subsystem.

4. The apparatus of claim 3 wherein said subsystem is an integrated circuit.

5. An apparatus having a first mode of operation and a second mode of operation comprising:
   a data bus;
   a first power supply operating in said first mode, but not in said second mode;
   a second power supply operating in said first mode and said second mode;
   a transistor, responsive to a first power supply voltage level, with a base, collector and emitter wherein said first power supply is electrically coupled to base and collector, said data bus line being electrically coupled to the emitter, and said second power supply being electrically coupled to said data bus;
   wherein said transistor electrically isolates said data bus from said first power supply in said second mode of operation and electrically connects said data bus to said first power supply in said first mode of operation.

6. The apparatus of claim 5 wherein the data bus is connected to the transistor via a resistor.

7. The apparatus of claim 6 wherein the resistor is located within subsystem.

8. The apparatus of claim 7 wherein said subsystem is an integrated circuit.

9. An apparatus having a first mode of operation and a second mode of operation comprising:
   a data bus;
   a power supply operating in said first mode and said second mode;
   a control signal active in said first mode; and
   a transistor, responsive to said control signal, with a base, collector and emitter wherein said power supply is electrically coupled to said collector and said data bus, said control signal is electrically coupled to said base, said data bus electrically coupled to the emitter;

wherein said transistor electrically isolates said data bus from said power supply in said second mode of operation and electrically connects said data bus to said power supply in said first mode of operation.

10. The apparatus of claim 9 wherein the data bus is connected to the transistor via a resistor 11. The apparatus of claim 10 wherein the resistor is located within a subsystem.

12. The apparatus of claim 11 wherein said subsystem is an integrated circuit.

13. A television signal processing apparatus having a first mode of operation and a second mode of operation comprising:
 a data bus;
 a first subsystem operative in said first mode of operation;
 a second subsystem operative in said first mode of operation and said second mode of operation;
 a control signal active in said first mode; and a transistor, responsive to said control signal, wherein said first subsystem and said second subsystem are both connected to said data bus;
 wherein said data bus is connected to a first power supply via a first resistor integrated within said first subsystem and said data bus is connected to a second power supply via a second resistor integrated within said second subsystem; and
 wherein said first resistor is electrically isolated from said first power supply during said second mode of operation and electrically connected to said first power supply during said first mode of operation by said transistor.

14. The television signal processing apparatus of claim 13 wherein said first subsystem is an integrated circuit.

15. The television signal processing apparatus of claim 13 wherein said second subsystem is an integrated circuit.

* * * * *